(12) United States Patent
Lee et al.

(10) Patent No.: US 9,806,046 B2
(45) Date of Patent: Oct. 31, 2017

(54) SEMICONDUCTOR DEVICE STRUCTURE AND MANUFACTURING METHOD

(71) Applicant: Taiwan Semiconductor Manufacturing Co., Ltd, Hsin-Chu (TW)

(72) Inventors: Li-Guo Lee, Taipei (TW); Yung-Sheng Liu, Hsinchu (TW); Yi-Chen Liu, Zhubei (TW); Yi-Jen Lai, Hsinchu (TW); Chun-Jen Chen, Jhubei (TW); Hsi-Kuei Cheng, Zhubei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 172 days.

(21) Appl. No.: 14/208,948

(22) Filed: Mar. 13, 2014

(65) Prior Publication Data

US 2015/0262955 A1    Sep. 17, 2015

(51) Int. Cl.
*H01L 23/00* (2006.01)

(52) U.S. Cl.
CPC .............. *H01L 24/14* (2013.01); *H01L 24/05* (2013.01); *H01L 24/06* (2013.01); *H01L 24/13* (2013.01); *H01L 24/03* (2013.01); *H01L 24/11* (2013.01); *H01L 2224/0345* (2013.01); *H01L 2224/03452* (2013.01); *H01L 2224/03462* (2013.01); *H01L 2224/0401* (2013.01); *H01L 2224/05013* (2013.01); *H01L 2224/05023* (2013.01); *H01L 2224/0558* (2013.01); *H01L 2224/05124* (2013.01); *H01L 2224/05147* (2013.01); *H01L 2224/05558* (2013.01); *H01L 2224/05564* (2013.01); *H01L 2224/05568* (2013.01); *H01L 2224/05655* (2013.01); *H01L 2224/05666* (2013.01); *H01L 2224/1132* (2013.01); *H01L 2224/1134* (2013.01); *H01L 2224/11334* (2013.01); *H01L 2224/11462* (2013.01); *H01L 2224/13006* (2013.01); *H01L 2224/13007* (2013.01); *H01L 2224/13014* (2013.01); *H01L 2224/13023* (2013.01); *H01L 2224/13147* (2013.01); *H01L 2224/1403* (2013.01); *H01L 2224/1411* (2013.01); *H01L 2224/16058* (2013.01); *H01L 2224/16238* (2013.01); *H01L 2224/73204* (2013.01); *H01L 2224/81191* (2013.01); *H01L 2224/81203* (2013.01)

(58) Field of Classification Search
CPC . H01L 24/05; H01L 24/10; H01L 2224/0401; H01L 24/11; H01L 24/13; H01L 24/14; H01L 24/06; H01L 24/32; H01L 24/81; H01L 24/83; H01L 2224/0345; H01L 2224/03452; H01L 2224/03462; H01L 2224/05013; H01L 2224/05023; H01L 2224/05124; H01L 2224/05147; H01L 2224/05558; H01L 2224/05564; H01L 2224/05568; H01L 2224/0558; H01L 2224/05655; H01L 2224/05666; H01L 2224/1132; H01L 2224/11334; H01L 2224/1134; H01L 2224/11462; H01L 2224/13006; H01L 2224/13007; H01L 2224/13014; H01L 2224/13023; H01L 2224/12147

See application file for complete search history.

(56) References Cited

U.S. PATENT DOCUMENTS 7,388,294 B2 * 6/2008 Klein ................. H01L 21/563
                                                  257/686
9,269,681 B2 * 2/2016 Jomaa ................ H01L 24/11
(Continued)

*Primary Examiner* — Cheung Lee
*Assistant Examiner* — Stephen C Smith
(74) *Attorney, Agent, or Firm* — Haynes and Boone, LLP

(57) ABSTRACT

A semiconductor device structure and a manufacturing method are provided. The semiconductor device structure includes a semiconductor substrate and a dielectric layer over the semiconductor substrate. The semiconductor device structure also includes a conductive trace over the dielectric layer. The semiconductor device structure further includes a conductive feature over the conductive trace, and a width of the conductive feature is substantially equal to or larger than a maximum width of the conductive trace. In addition, the semiconductor device structure includes a conductive bump over the conductive feature.

20 Claims, 14 Drawing Sheets

(56) References Cited

U.S. PATENT DOCUMENTS

| | | | | |
|---|---|---|---|---|
| 2006/0076679 A1* | 4/2006 | Batchelor | ............... | H01L 24/02 |
| | | | | 257/737 |
| 2011/0193219 A1* | 8/2011 | Lai | ......................... | H01L 24/16 |
| | | | | 257/737 |
| 2011/0254154 A1* | 10/2011 | Topacio | .................. | H01L 24/05 |
| | | | | 257/737 |
| 2012/0223428 A1* | 9/2012 | Pendse | .................... | H01L 24/16 |
| | | | | 257/737 |
| 2012/0248614 A1* | 10/2012 | Gandhi | ............. | H01L 23/49811 |
| | | | | 257/762 |
| 2013/0001778 A1* | 1/2013 | Shieh | ................ | H01L 23/49838 |
| | | | | 257/738 |
| 2013/0147030 A1* | 6/2013 | Chang | ............... | H01L 23/49838 |
| | | | | 257/737 |
| 2013/0241071 A1* | 9/2013 | Hsieh | ...................... | H01L 24/13 |
| | | | | 257/773 |
| 2013/0270693 A1* | 10/2013 | Tseng | ................ | H01L 23/49838 |
| | | | | 257/737 |
| 2014/0110847 A1* | 4/2014 | Tseng | ...................... | H01L 24/16 |
| | | | | 257/762 |
| 2014/0138831 A1* | 5/2014 | Jomaa | .................. | H01L 21/563 |
| | | | | 257/750 |

\* cited by examiner

SEMICONDUCTOR DEVICE STRUCTURE AND MANUFACTURING METHOD

BACKGROUND

Semiconductor devices are used in a variety of electronic applications, such as personal computers, cell phones, digital cameras, and other electronic equipment. The fabrication of the semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices.

New packaging technologies have been developed to improve the density and functions of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
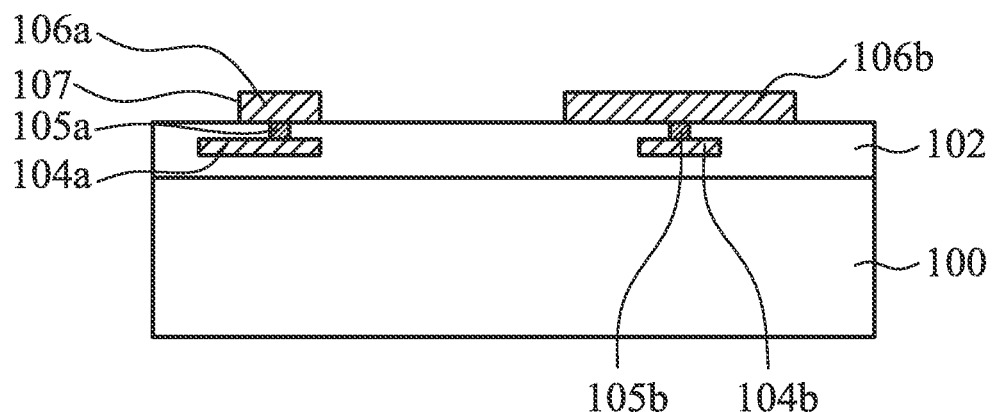
FIGS. 1A-1D are cross-sectional views of various stages of a process for forming a semiconductor device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the performance of a first process before a second process in the description that follows may include embodiments in which the second process is performed immediately after the first process, and may also include embodiments in which additional processes may be performed between the first and second processes. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1D are cross-sectional views of various stages of a process for forming a semiconductor device structure, in accordance with some embodiments. FIGS. 2A-2C are top views of various stages of a process for forming a semiconductor device structure, in accordance with some embodiments. Referring to FIG. 1A, a dielectric layer 102 is formed over a semiconductor substrate 100, in accordance with some embodiments. In some embodiments, the semiconductor substrate 100 is a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

As shown in FIG. 1A, various conductive features are formed in the dielectric layer 102, in accordance with some embodiments. In some embodiments, the conductive features include multiple horizontal interconnects, such as conductive lines 104a and 104b, and multiple vertical interconnects, such as conductive vias 105a and 105b. In some embodiments, the dielectric layer 102 is a stack of multiple dielectric layers. The conductive features formed in the dielectric layer 102 form conductive paths between device elements (not shown) formed in or on the semiconductor substrate 100 and conductive traces over the dielectric layer 102. In some embodiments, a device element (not shown) is electrically connected to a conductive trace 106a over the dielectric layer 102 through the conductive line 104a and the conductive via 105a. The device element may be a doped region formed in or over the semiconductor substrate 100. Alternatively, the device element may be a gate electrode formed over or in the semiconductor substrate 100. More conductive lines and conductive vias (not shown) may be formed between the conductive lines 104a and the device element to form the conductive path.

Similarly, a conductive trace 106b is formed over the dielectric layer 102, as shown in FIG. 1A in accordance with some embodiments. The conductive trace 106b is electrically connected to another device element (not shown) formed in or on the semiconductor substrate 100. Through the conductive features, including, for example, the conductive via 105b and the conductive line 104b, the electrical path between the device element and the conductive trace 106b is established.

In some embodiments, the conductive traces 106a and 106b are also referred to as top metals. In some embodiments, the conductive traces 106a and 106b are made of AlCu, Al, Cu, other suitable material, or a combination thereof. In some embodiments, the conductive traces 106a and 106b are formed by patterning a conducting layer deposited over the dielectric layer 102. For example, the conductive layer is patterned using a photolithography process and an etching process to form the conductive traces.

In some embodiments, the dielectric layer 102 is made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. In some embodiments, the conductive features formed in the dielectric layer 102 are made of copper, aluminum, tungsten, titanium, nickel, gold, platinum, other suitable material, or a combination thereof. A number of deposition, photolithography, and etching processes may be performed to form the dielectric layer 102 and the conductive features therein.

As shown in FIG. 1A, there is no passivation layer, such as a silicon nitride layer or the like, formed on the conductive traces 106a and 106b, in accordance with some embodiments. Therefore, fabrication cost and fabrication time are reduced. Embodiments of the disclosure are not limited thereto. In some other embodiments, a passivation layer (not shown) is formed over the dielectric layer 102 and the conductive traces 106a and 106b to partially cover the conductive traces 106a and 106b.

Referring to FIG. 2A, a top view of conductive traces 106a and 106b over the dielectric layer 102 is shown, in accordance with some embodiments. In some embodiments, the conductive traces 106a and 106b are conductive lines or conductive traces with uniform widths. In some embodiments, the conductive traces 106a and 106b include no wider (or protruded) region such as a circle region or an octangular region defined to serve as pad regions. Any region of the conductive traces 106a and 106b may be used as a pad region for forming a conductive bump thereon. No specific wider (or protruded) region is formed or defined to serve as the pad regions. In some embodiments, because no wider (or protruded) region is formed, the spacing between neighboring conductive traces is reduced. The density of the conductive traces is increased. More conductive paths connecting the device elements in the semiconductor substrate 100 may be established.

Figure 1B:
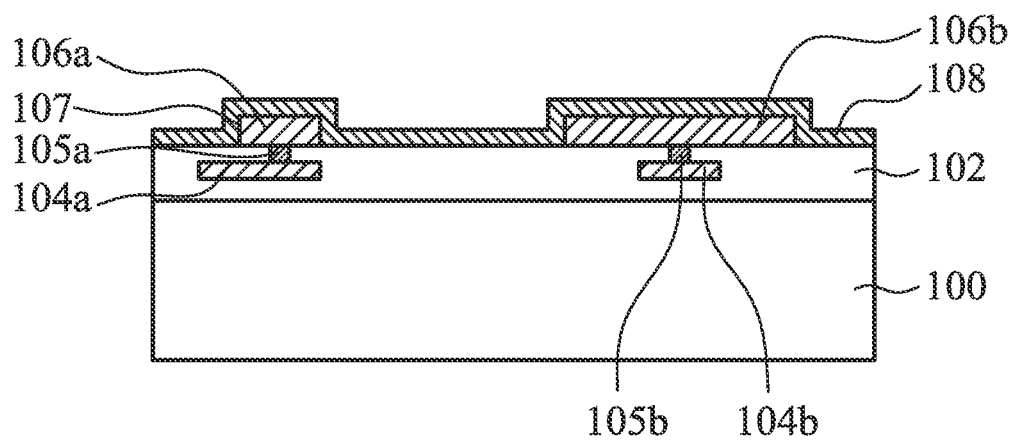
Figure 2A:
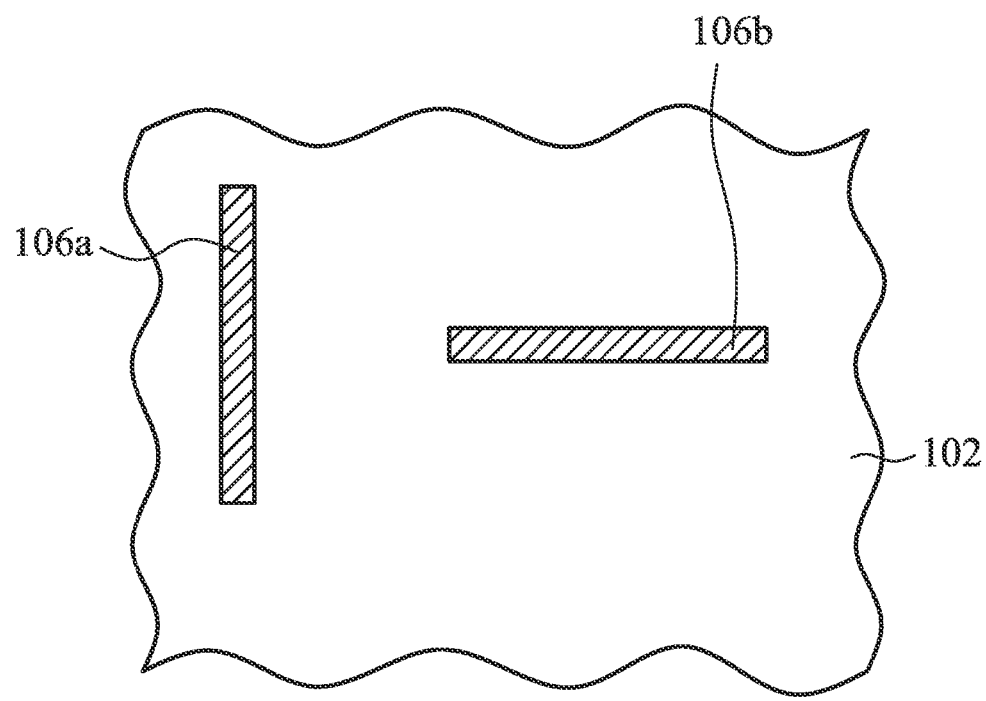
FIGS. 2A-2C are top views of various stages of a process for forming a semiconductor device structure, in accordance with some embodiments.
Figure 2B:
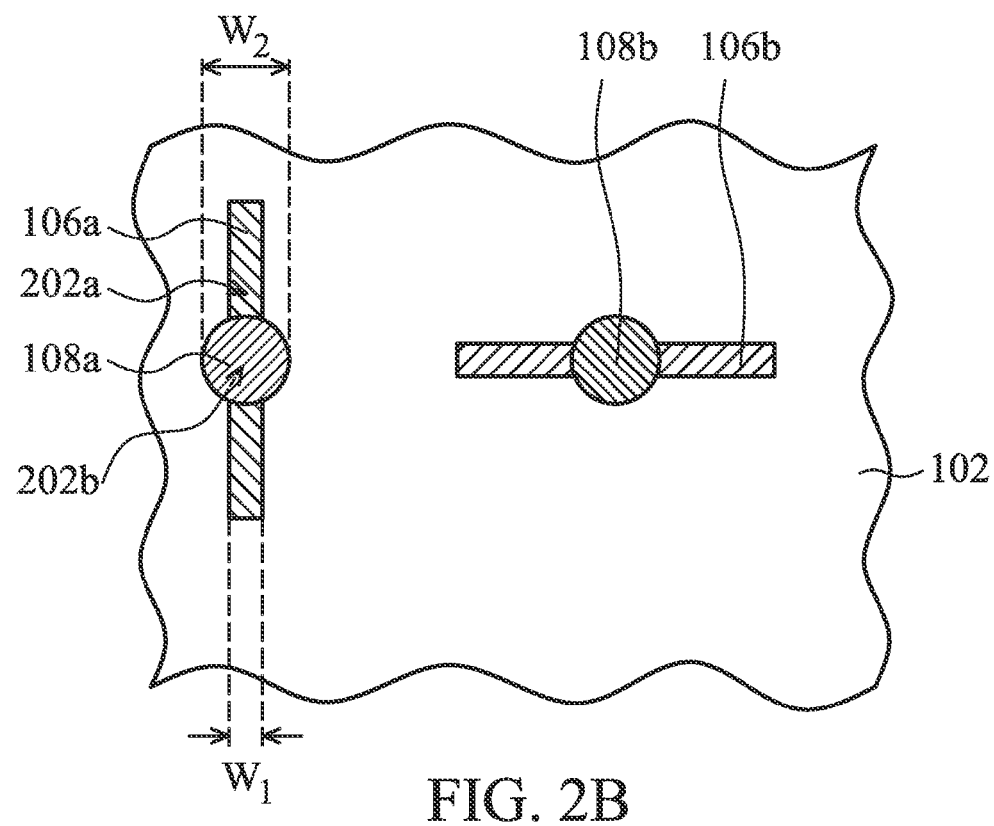
Figure 2C:
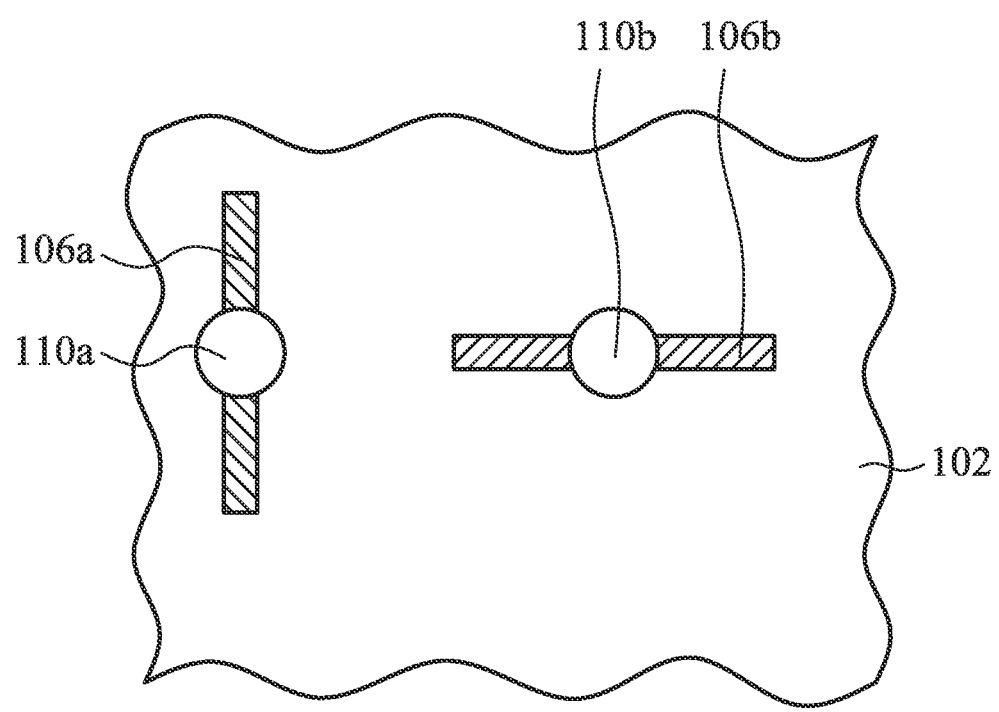

Afterwards, a conductive layer 108 is deposited over the dielectric layer 102 and the conductive traces 106a and 106b, as shown in FIG. 1B in accordance with some embodiments. In some embodiments, the conductive layer 108 is an under-bump metallization (UBM) layer. In some embodiments, the conductive layer 108 is a single layer or a stack of multiple layers. For example, the conductive layer 108 may be made of Ti, TiW, TiCu, Ni, other suitable material, or a combination thereof. In some embodiments, the conductive layer 108 includes sub-layers including, for example, a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of many copper alloys that include silver, chromium, nickel, tin, gold, or a combination thereof. In some embodiments, the conductive layer 108 is deposited by using a PVD process, a CVD process, an electroplating process, a spin-on process, other applicable process, or a combination thereof.

Figure 1C:
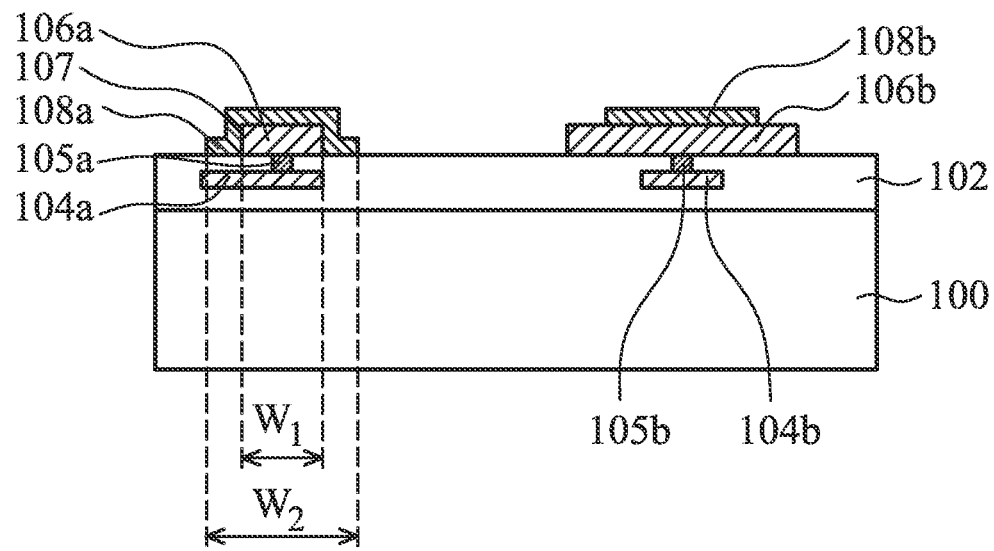

Afterwards, the conductive layer 108 is patterned to form conductive features over the conductive traces, as shown in FIG. 1C and/or FIG. 2B in accordance with some embodiments. For example, photolithography and etching processes are performed to pattern the conductive layer 108 into the conductive features including conductive features 108a and 108b. As shown in FIG. 1C and/or FIG. 2B, the conductive features 108a and 108b are formed over the conductive traces 106a and 106b, respectively. In some embodiments, the conductive features 108a and 108b are under-bump metallization (UBM) elements.

In some embodiments, the conductive feature 108a extends beyond the conductive trace 106a. In some embodiments, the conductive feature 108a extends over a sidewall 107 of the conductive trace 106a, as shown in FIG. 1C and/or FIG. 2B. In some embodiments, the conductive feature 106a further extends over the dielectric layer 102. Similarly, the conductive feature 108b extends over a sidewall of the conductive trace 106b, as shown in FIG. 2B in accordance with some embodiments.

In some embodiments, the conductive features 108a and 108b are wider than the conductive traces 106a and 106b thereunder, respectively. As shown in FIG. 1C and/or FIG. 2B, the conductive feature 108a has a width $W_2$ which is larger than a width $W_1$ of the conductive trace 106a, in accordance with some embodiments. In some embodiments, the width $W_1$ is a maximum width of the conductive trace 106a. The width $W_1$ may be in a range from about 1 μm to about 40 μm. Alternatively, the width $W_1$ may be in a range from about 5 μm to about 30 μm. The width $W_2$ is larger than the width $W_1$ and may be in a range from about 15 μm to about 50 μm. As shown in FIGS. 2A and 2B, the conductive trace 106a has various portions. For example, the conductive trace 106a has a portion 202b covered by the conductive feature 108a and a portion 202a not covered by the conductive feature 108a. In some embodiments, the widths of the portions 202a and 202b of the conductive trace 106a are substantially the same. The conductive feature 108a is not formed over a specific wider (or protruded) portion of the conductive trace 106a.

Figure 1D:
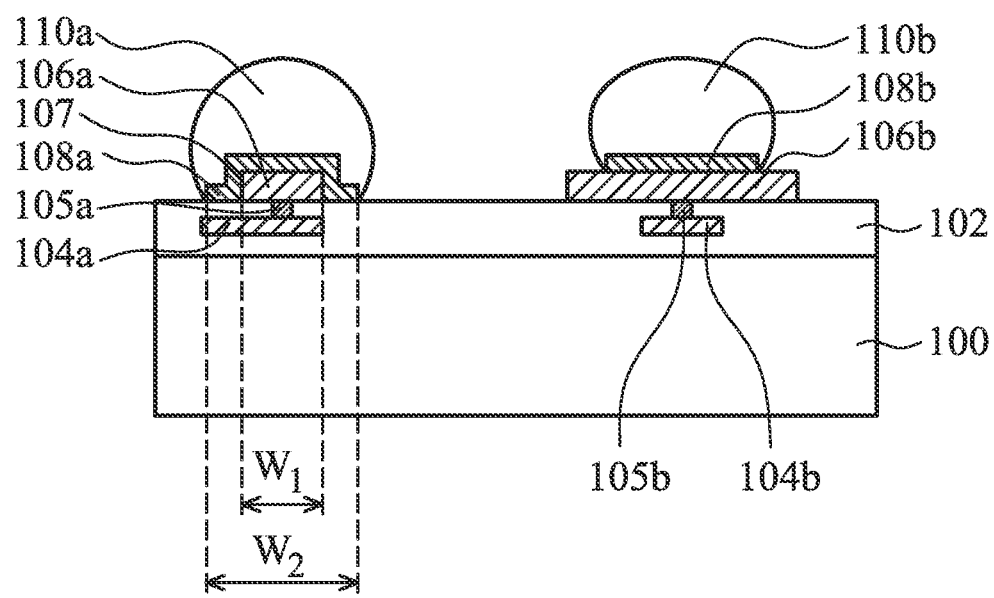

As shown in FIG. 1D and/or FIG. 2C, conductive bumps 110a and 110b are respectively formed over the conductive features 108a and 108b, in accordance with some embodiments. In some embodiments, the conductive bumps 110a and 110b are made of a solder material. The solder material may contain lead or may be lead free. In some embodiments, the conductive bumps 110a and 110b are formed by using direct placement, evaporation, electroplating, printing, jetting, stud bumping, other applicable methods, or a combination thereof. In some other embodiments, the conductive bumps 110a and 110b are made of other suitable conductive materials, such as copper. In some embodiments, the conductive bumps 110a and 110b are wider than the conductive traces 106a and 106b, respectively. In some embodiments, the conductive bumps 110a and 110b are made of other suitable conductive material. In some embodiments, the conductive features 108a and 108b are not formed. The conductive bumps 110a and 110b are formed directly on the conductive traces 106a and 106b, respectively.

As mentioned above, the conductive trace includes no wider portion (or protruded) region to serve as a pad region. The spacing between neighboring conductive traces is reduced. The density of the conductive traces is increased. Accordingly, the density of the conductive bumps is also increased. Pitches between the conductive bumps are significantly reduced in some embodiments. In some embodiments, no copper pillar or copper post is formed between the conductive bump 110a and the conductive feature 108a. Therefore, fabrication cost and fabrication time are reduced. The thickness of the semiconductor device structure is also reduced. After a subsequent packaging process, a package structure having a reduced thickness may be achieved.

Figure 3A:
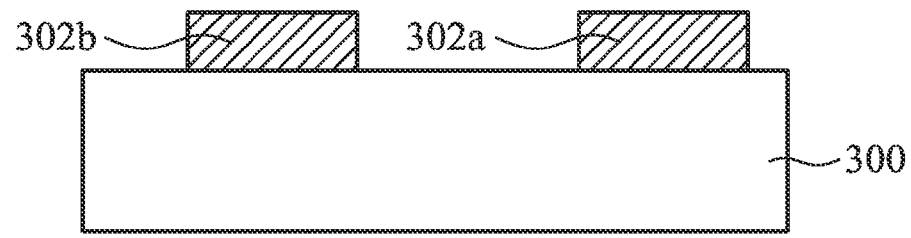
FIGS. 3A-3B are cross-sectional views of various stages of a process for forming a semiconductor device structure, in accordance with some embodiments.
Figure 3B:
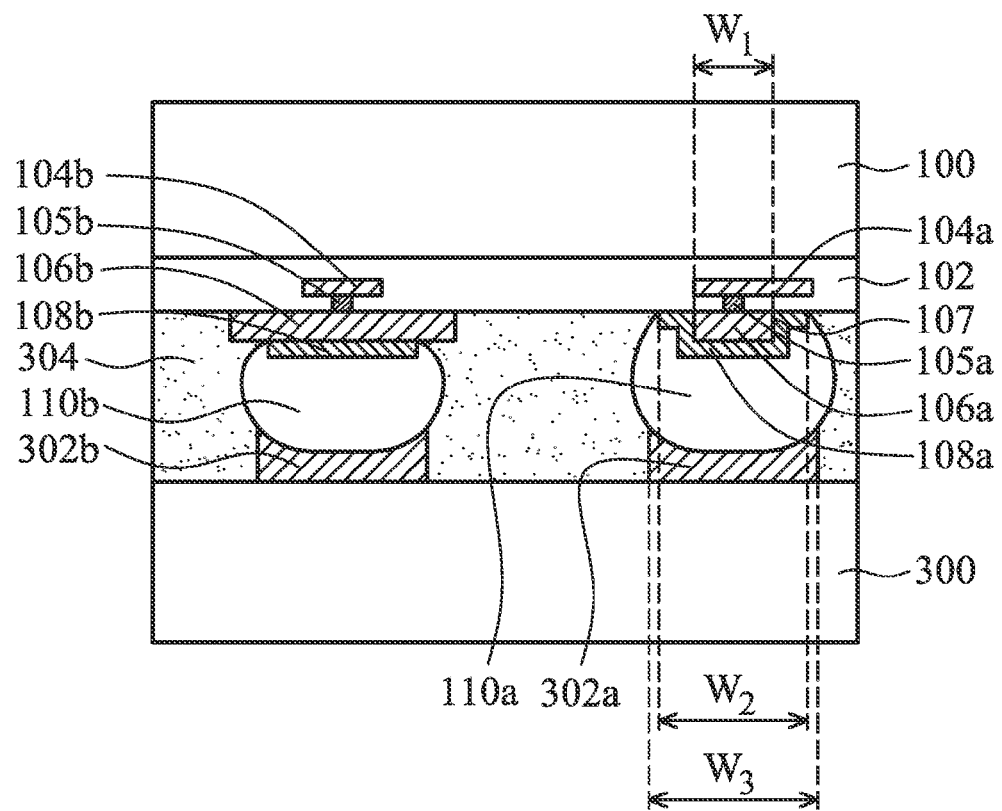

In some embodiments, the structure shown in FIG. 1D is bonded to a substrate. FIGS. 3A-3B are cross-sectional views of various stages of a process for forming a semiconductor device structure, in accordance with some embodiments.

As shown in FIG. 3A, a substrate 300 is provided, which has conductive traces 302a and 302b formed thereon, in accordance with some embodiments. In some embodiments, the substrate 300 is an organic substrate. In some other embodiments, the substrate 300 is a multiple-layer circuit board. In some embodiments, the substrate 300 includes bismaleimide triazine (BT) resin, FR-4 (a composite material composed of woven fiberglass cloth with an epoxy resin binder that is flame resistant), ceramic, glass, plastic, tape, film, or other supporting materials. In some other embodiments, the substrate 300 is made of a semiconductor material. The substrate 300 may be made of a semiconductor wafer, or a portion of wafer. In some other embodiments, the substrate 300 is a printed circuit board. In some embodiments, the substrate 300 includes silicon, gallium arsenide, silicon on insulator ("SOI") or other similar materials. In some embodiments, the substrate 300 also includes passive devices, such as resistors, capacitors, inductors and the like, or active devices, such as transistors. In some embodiments, the substrate 300 includes additional integrated circuits. The substrate 300 may further include through substrate vias (TSVs) and may be used as an interposer. In some embodiments, the conductive traces 302a and 302b are used to receive conductive terminals of another element, such as the structure shown in FIG. 1D. In some embodiments, the conductive traces 302a and 302b are made of copper, aluminum, gold, platinum, titanium, nickel, other suitable material, or a combination thereof. In some embodiments, a conductive layer is deposited and patterned to form the conductive traces 302a and 302b.

As shown in FIG. 3B, the structure shown in FIG. 1D is bonded with the substrate 300 to form a package structure, in accordance with some embodiments. In some embodiments, the conductive traces 302a and 302b are bonded with the conductive bumps 110a and 110b, respectively. In some embodiments, the conductive traces 302a and 302b are in direct contact with the conductive bumps 110a and 110b, respectively. In some embodiments, the conductive traces 302a and 302b and the conductive bumps 110a and 110b are bonded together using a thermal compression process, a thermal reflow process, other applicable processes, or a combination thereof. In some embodiments, a flux (not shown) or a solder paste (not shown) is used between the conductive traces 302a and 302b and the conductive bumps 110a and 110b to assist in the bonding process.

As shown in FIG. 3B, the conductive trace 302a has a width $W_3$. The width $W_3$ and the width $W_2$ of the conductive feature 108a may be defined along the same direction. In some embodiments, the width $W_3$ is in a range from about 15 μm to about 40 μm. In some embodiments, the difference between the widths $W_2$ and $W_3$ is not too much to ensure that no high stress is formed between the conductive traces and the conductive bumps during and/or after the bonding process. In some embodiments, a ratio of the width $W_2$ to the width $W_3$ ($W_2/W_3$) is in a range from about 0.5 to about 2.

In some embodiments, the conductive traces 106a and 106b, the conductive features 108a and 108b, the conductive bumps 110a and 110b, and the conductive traces 302a and 302b together form bonding structures between the semiconductor substrate 100 and the substrate 300. As shown in FIG. 3B, a protection material 304 is formed between the semiconductor substrate 100 and the substrate 300, in accordance with some embodiments. The protection material 304 may be used to protect the bonding structures between the semiconductor substrate 100 and the substrate 300. In some embodiments, the protection material 304 includes an underfill material, a non-conductive paste (NCP), other suitable insulating materials, or a combination thereof. In some embodiments, the protection material 304 is dispensed, flowed, and/or applied to surround the bonding structure of the package structure.

As shown in FIG. 3B, the protection material 304 surrounds the conductive traces 106a and 106b, the conductive features 108a and 108b, the conductive bumps 110a and 110b, and the conductive traces 302a and 302b. In some embodiments, the protection material 304 is in direct contact with the conductive traces 106a and 106b, the conductive features 108a and 108b, the conductive bumps 110a and 110b, and the conductive traces 302a and 302b. In some embodiments, the protection material 304 includes a resin material such as an epoxy resin, a phenol resin, other suitable material, or a combination thereof. In some embodiments, the protection material 304 further includes other additives, such as silicon oxide, carbon nanotube, other suitable additives, or a combination thereof. In some embodiments, the protection material 304 is dispensed, flowed, and/or applied between the semiconductor substrate 100 and the substrate 300. However, in some other embodiments, the protection material 304 is not formed.

Embodiments of the disclosure have many variations. For example, the conductive feature (such as the UBM element) is not limited to being wider than the conductive trace thereunder.

Figure 4A:
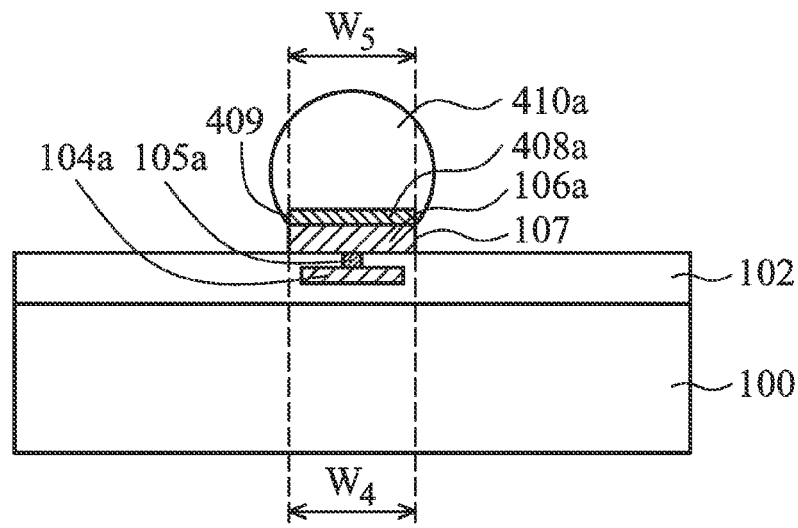
FIGS. 4A-4B are cross-sectional views of various stages of a process for forming a semiconductor device structure, in accordance with some embodiments.
Figure 4B:
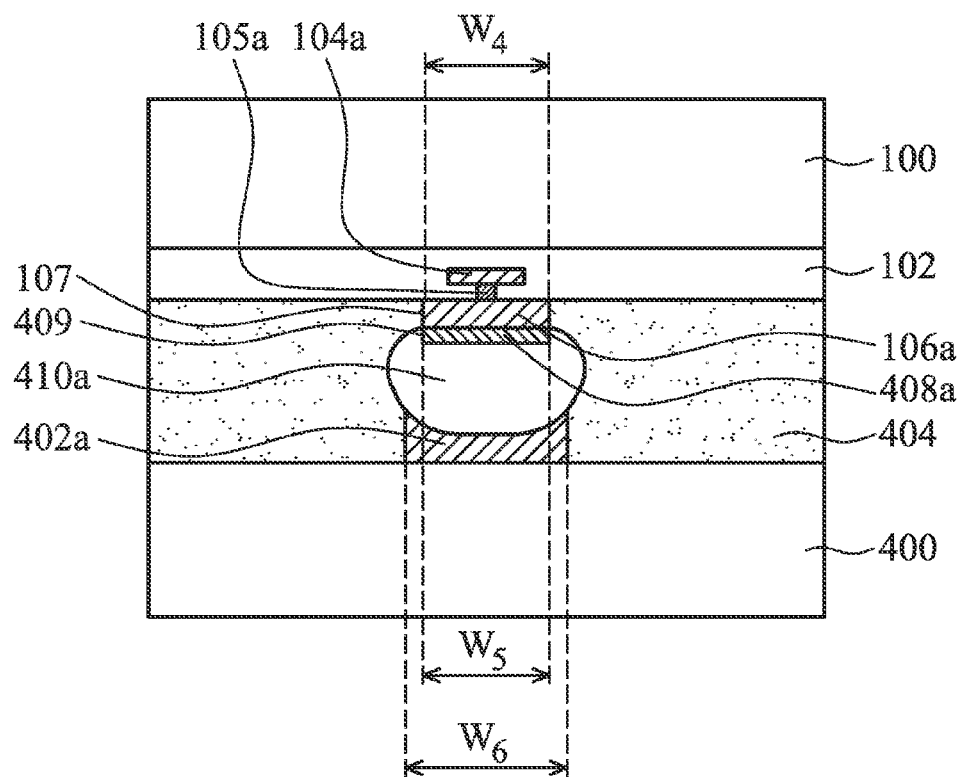

FIGS. 4A-4B are cross-sectional views of various stages of a process for forming a semiconductor device structure, in accordance with some embodiments. As shown in FIG. 4A, a conductive feature 408a is formed over a structure similar to that shown in FIG. 1A, in accordance with some embodiments. In some embodiments, the conductive feature 408a is a UBM element. In some embodiments, a sidewall 409 of the conductive feature 408a is aligned with the sidewall 107 of the conductive trace 106a, as shown in FIG. 4A. The conductive trace 106a has a width $W_4$, and the conductive feature 408a has a width $W_5$. In some embodiments, the widths $W_4$ is substantially equal to the width $W_5$. In some embodiments, the width $W_4$ is a maximum width of the conductive trace 106a. The material and formation method of the conductive feature 408a may be similar to those of the conductive feature 108a shown in FIG. 1. A patterning process may be used to pattern a conductive layer (not shown) deposited over the conductive trace 106a to form the conductive feature 408a.

Afterwards, a conductive bump 410a is formed over the conductive feature 408a, as shown in FIG. 4A in accordance with some embodiments. The material and the formation method of the conductive bump 410a may be similar to those of the conductive bump 110a shown in FIG. 1D.

Figure 5A:
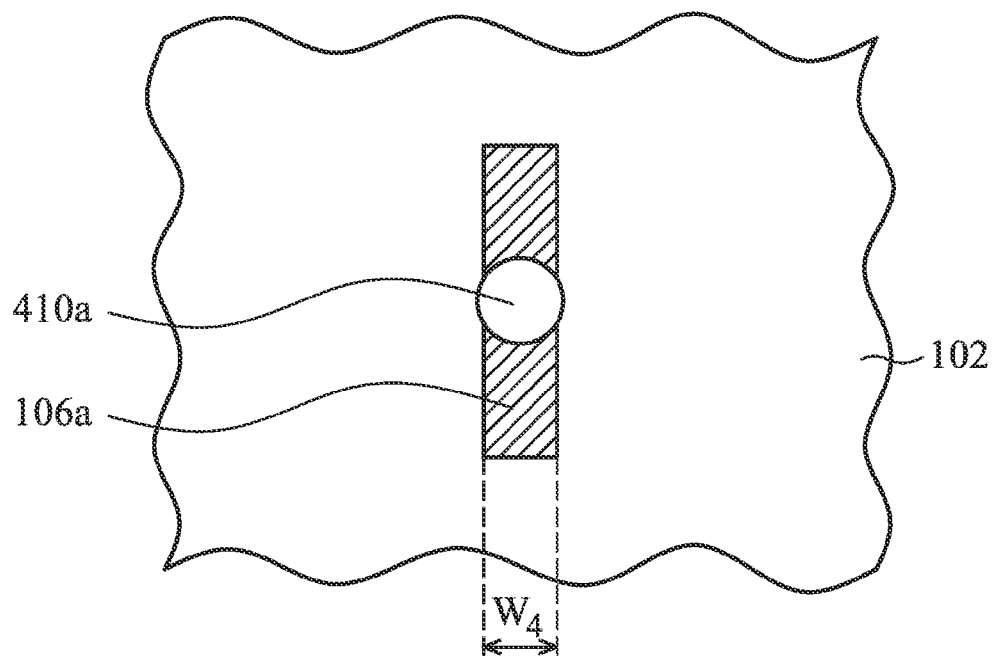
FIGS. 5A and 5B are top views of semiconductor device structures, in accordance with some embodiments.

FIG. 5A is a top view of a semiconductor device structure, in accordance with some embodiments. In some embodiments, FIG. 5A is a top view of the structure shown in FIG. 4A. In some embodiments, the width of the conductive bump 410a and the width $W_4$ of the conductive trace 106a are substantially the same. In some embodiments, the width of the conductive bump 410a is slightly wider than the width $W_4$ of the conductive trace 106a. The conductive bump 410a may substantially extend beyond the conductive trace 106a.

As shown in FIG. 4B, a substrate 400 having a conductive trace 402a formed thereon is provided, in accordance with some embodiments. In some embodiments, the material and formation method of the conductive trace 402 and the substrate 400 are similar to those of the conductive traces 302a and 302b and the substrate 300 shown in FIG. 3A.

Afterwards, the structure shown in FIG. 4A is bonded with the substrate 400, as shown in FIG. 4B in accordance with some embodiments. In some embodiments, the conductive trace 402a is bonded with the conductive bump 410a. The conductive traces 402a may be in direct contact with the conductive bump 410a. In some embodiments, the conductive trace 402a and the conductive bump 410a are bonded together using a thermal compression process, a thermal reflow process, other applicable process, or a combination thereof. In some embodiments, a flux (not shown) or a solder paste (not shown) is used between the conductive trace 402a and the conductive bump 410a to assist in the bonding process.

As shown in FIG. 4B, the conductive trace 402a has a width $W_6$. The width $W_6$ and the width $W_5$ of the conductive feature 408a may be defined along the same direction. In some embodiments, the width $W_6$ is in a range from about 15 μm to about 40 μm. In some embodiments, the difference between the widths $W_5$ and $W_6$ is not too much to ensure that no high stress is formed between the conductive traces and the conductive bumps during and/or after the bonding process. In some embodiments, a ratio of the width $W_5$ to the width $W_6$ ($W_5/W_6$) is in a range from about 0.5 to about 2.

As shown in FIG. 4B, a protection material 404 is formed between the semiconductor substrate 100 and the substrate 400, in accordance with some embodiments. As shown in FIG. 4B, the protection material 404 surrounds the conductive trace 106a, the conductive feature 408a, the conductive bump 410a, and the conductive trace 402a. In some embodiments, the protection material 404 is in direct contact with the conductive trace 106a, the conductive feature 408a, the conductive bump 410a, and the conductive trace 402a. In some embodiments, the materials and the formation methods of the protection material 404 are similar to those of the protection material 304 shown in FIG. 3B. However, in some other embodiments, the protection material 404 is not formed.

Embodiments of the disclosure have many variations. In some embodiments, more than one conductive feature (such as more than one UBM element) and/or more than one conductive bump are/is formed over a single conductive trace.

Figure 5B:
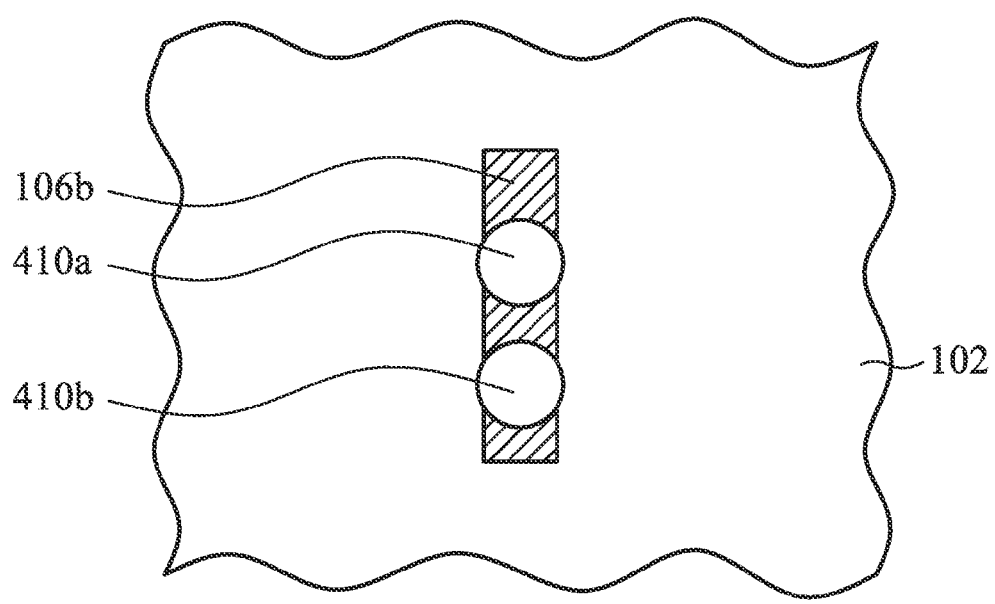

FIG. 5B is a top view of a semiconductor device structure, in accordance with some embodiments. As shown in FIG. 5B, two or more conductive features (such as UBM elements, not shown) are formed over the conductive trace 106b, in accordance with some embodiments. In some embodiments, the width of each of the conductive features is substantially equal to the width of the conductive trace 106b. In some other embodiments, the width of each of the conductive features is larger than the width of the conductive trace 106b. The conductive features may define and/or determine the position and/or the profile of the conductive bumps thereon. In some embodiments, each of the widths of the conductive bumps 410a and 410b and the width of the conductive trace 106b are also substantially the same. In some other embodiments, each of the widths of the conductive bumps 410a and 410b is slightly wider than the width of the conductive trace 106b. The conductive bumps 410a and 410b may substantially extend beyond the conductive trace 106b.

Embodiments of the disclosure have many variations. In some embodiments, a conductive feature (such as a UBM element) wider than a conductive trace thereunder and a conductive feature having a width substantially equal to that of a conductive trace thereunder coexist.

Figure 6:
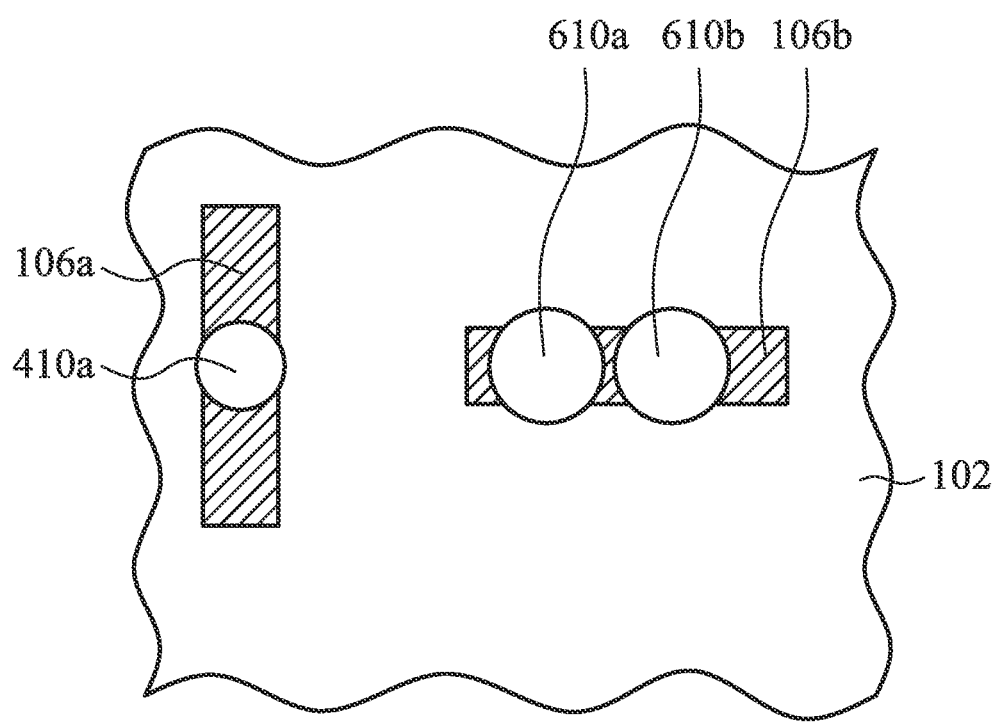
FIG. 6 is a top view of a semiconductor device structure, in accordance with some embodiments.

FIG. 6 is a top view of a semiconductor device structure, in accordance with some embodiments. As shown in FIG. 6, the conductive bump 410a is formed over the conductive trace 106a. In some embodiments, the width of the conductive bump 410a is substantially equal to that of the conductive trace 106a. In some embodiments, the width of the conductive feature (such as the UBM element, not shown) under the conductive bump 410a is also substantially equal to that of the conductive trace 106a, which is similar to that shown in FIG. 4A.

In some embodiments, two conductive bumps 610a and 610b are formed over the conductive trace 106b, as shown in FIG. 6. In some embodiments, each of the conductive bumps 610a and 610b is wider than the conductive trace 106b. In some embodiments, each of the conductive features (such as the UBM elements, not shown) under the conductive bumps 610a and 610b is also wider than the conductive trace 106b, which is similar to that shown in FIG. 1D. In some other embodiments, two or more conductive features are formed over the same conductive trace, and some of the conductive features have different widths. For example, a first UBM element and a second UBM element are formed over the same conductive trace. In some embodiments, the first UBM element is wider than the conductive trace thereunder, and the second UBM element has a width substantially equal to that of the conductive trace thereunder.

Figure 7A:
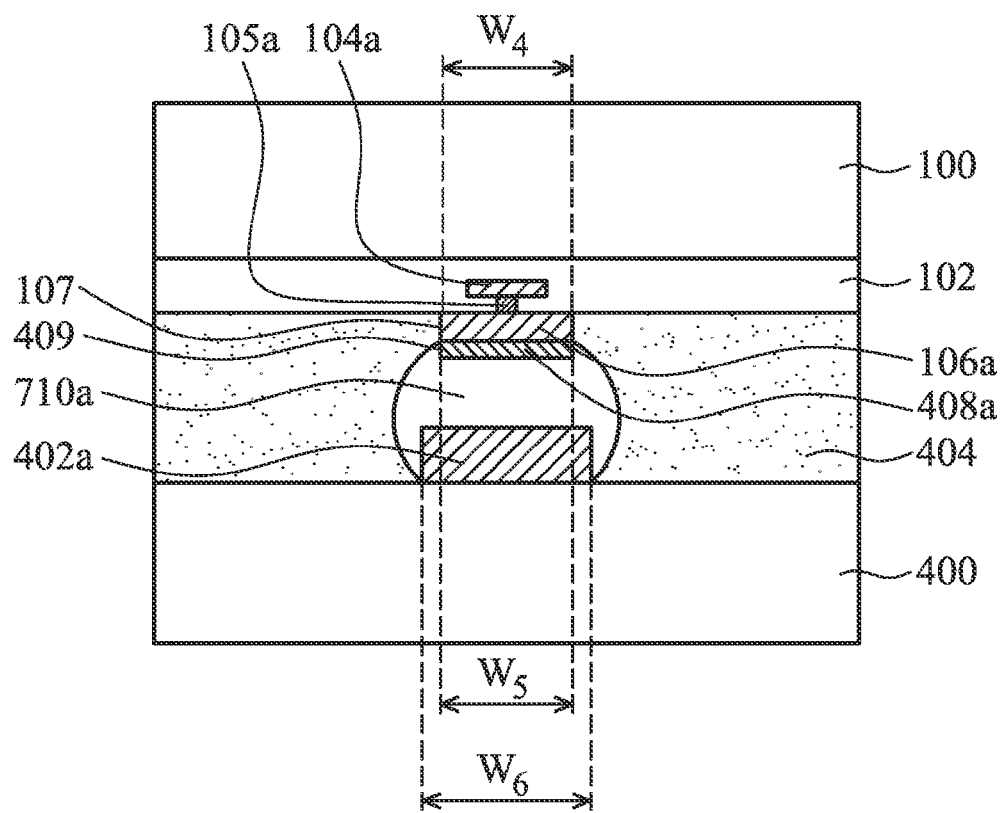
FIGS. 7A and 7B are cross-sectional views of semiconductor device structures, in accordance with some embodiments.
Figure 7B:
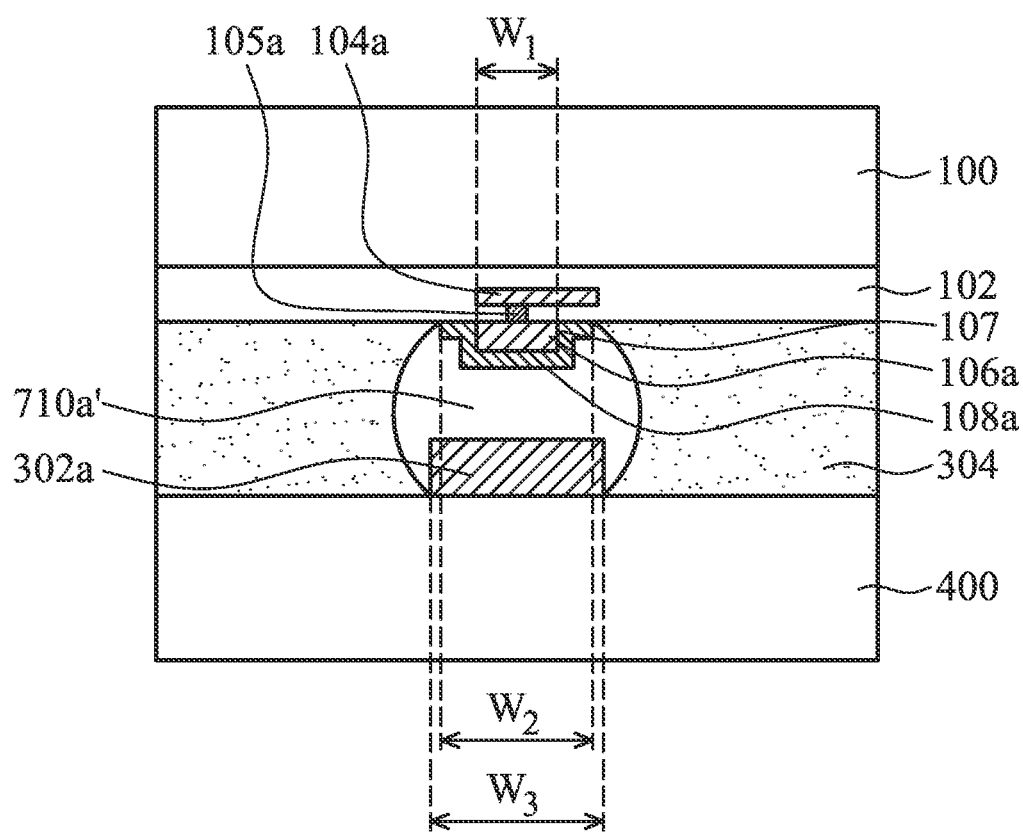

Embodiments of the disclosure have many variations. FIGS. 7A and 7B are cross-sectional views of semiconductor device structures, in accordance with some embodiments. FIG. 7A shows a semiconductor device structure (or a package structure), in accordance with some embodiments. The semiconductor device structure is similar to that shown in FIG. 4B. The main difference is that a conductive bump 710a is formed between the conductive traces 106a and 402a and covers the conductive trace 402a. As shown in FIG. 7A, side surfaces of the conductive trace 402a are covered by the conductive bump 710a. In some embodiments, the materials and the formation methods of the conductive bump 710a are similar to those of the conductive bump 410a shown in FIG. 4B.

FIG. 7B shows a semiconductor device structure (or a package structure), in accordance with some embodiments. The semiconductor device structure is similar to that shown in FIG. 3B. The main difference is that a conductive bump 710a' is formed between the conductive traces 106a and 302a and covers the conductive trace 302a. As shown in FIG. 7B, side surfaces of the conductive trace 302a are covered by the conductive bump 710a'. In some embodiments, the materials and the formation methods of the conductive bump 710a' are similar to those of the conductive bump 110a shown in FIG. 3B.

Embodiments of the disclosure have many variations. For example, a conductive pillar may be formed between the conductive traces of two bonded substrates. In some embodiments, the conductive pillar is also used as a conductive bump or a portion of the conductive bump connecting the conductive traces.

Figure 8A:
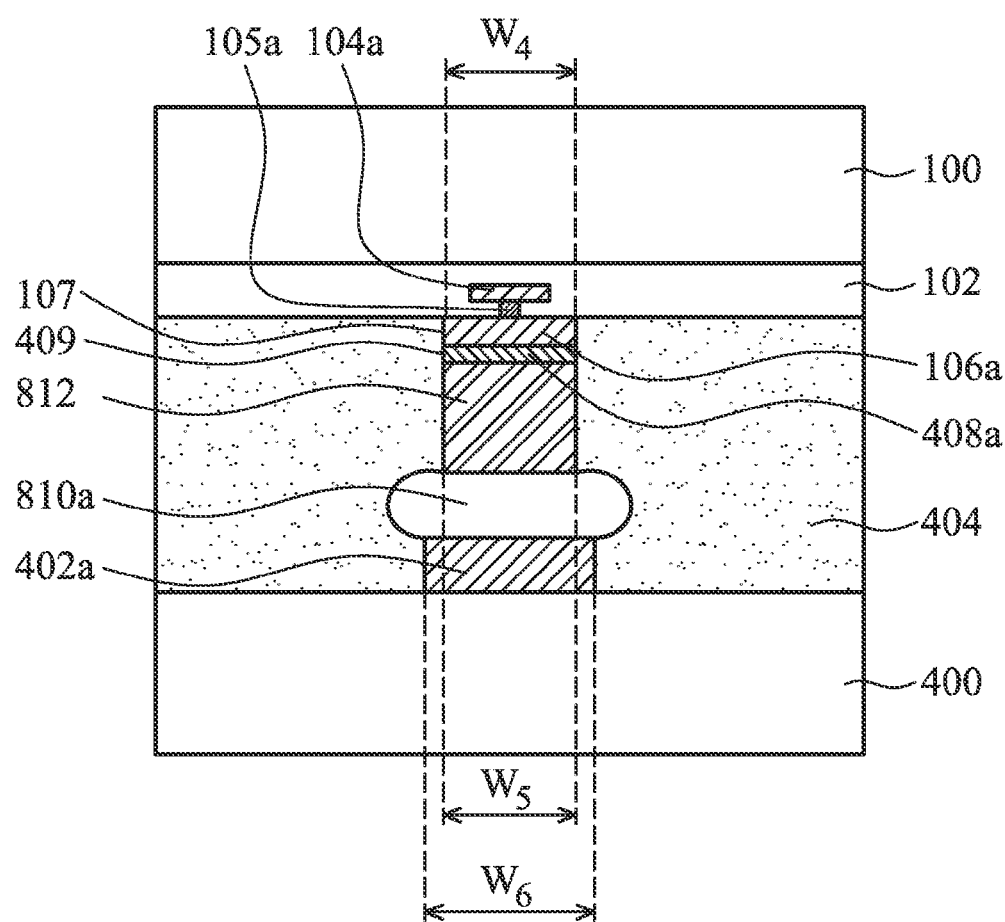
FIGS. 8A and 8B are cross-sectional views of semiconductor device structures, in accordance with some embodiments.
Figure 8B:
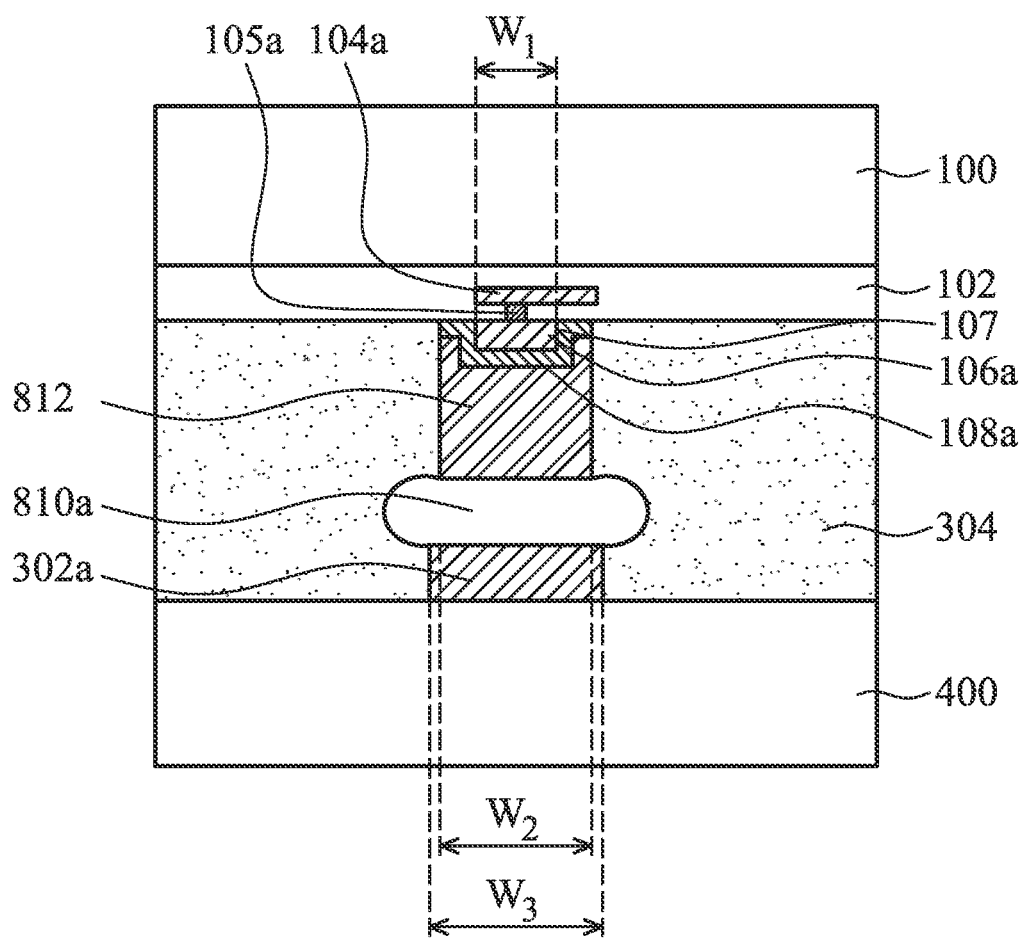

FIGS. 8A and 8B are cross-sectional views of semiconductor device structures, in accordance with some embodiments. FIG. 8A shows a semiconductor device structure (or a package structure) similar to that shown in FIG. 4B. In some embodiments, a conductive pillar 812 is formed over the conductive feature 408a, as shown in FIG. 8A. In some embodiments, the conductive pillar 812 is made of copper, aluminum, gold, platinum, titanium, nickel, other suitable materials, or a combination thereof. In some embodiments, the conductive pillar 812 is formed using an electroplating process, a PVD process, a CVD process, a spin-on process, other applicable processes, or a combination thereof. As shown in FIG. 8A, a solder bump 810a is formed to bond the conductive pillar 812 and the conductive trace 402a together, in accordance with some embodiments. The materials and the formation methods of the solder bump 810a may be similar to those of the conductive bump 410a shown in FIG. 4B. In some embodiments, the conductive pillar 812 and the solder bump 810a are together used as a conductive bump between the semiconductor substrate 100 and the substrate 400.

FIG. 8B shows a semiconductor device structure (or a package structure) similar to that shown in FIG. 3B. In some embodiments, the conductive pillar 812 is formed over the conductive feature 108a, as shown in FIG. 8B. In some embodiments, the materials and the formation methods of the conductive pillar 812 are similar to those of the conductive pillar 812 shown in FIG. 8A. As shown in FIG. 8B, the solder bump 810a is formed to bond the conductive pillar 812 and the conductive trace 302a together, in accordance with some embodiments. The materials and the formation methods of the solder bump 810a may be similar to those of the conductive bump 110a shown in FIG. 3B. In some embodiments, the conductive pillar 812 and the solder bump 810a are together used as a conductive bump between the semiconductor substrate 100 and the substrate 400.

Figure 9A:
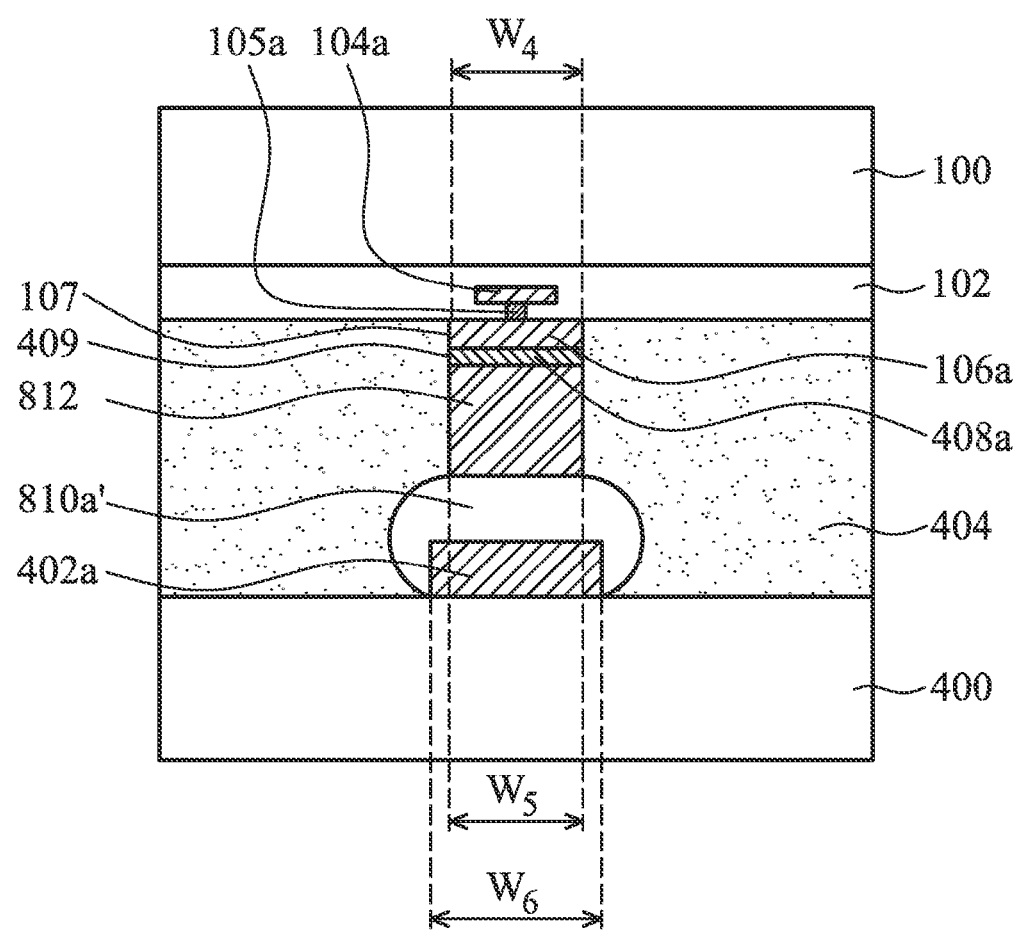
FIGS. 9A and 9B are cross-sectional views of semiconductor device structures, in accordance with some embodiments.
Figure 9B:
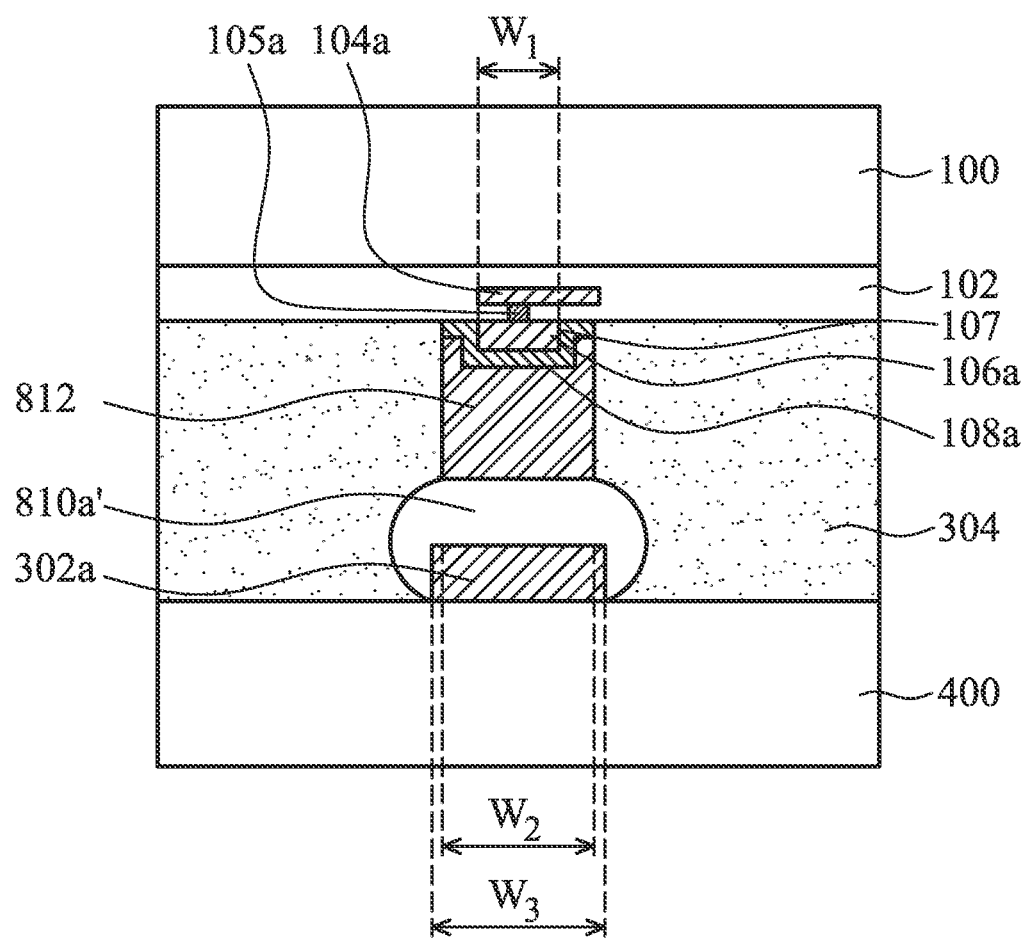

Embodiments of the disclosure have many variations. FIGS. 9A and 9B are cross-sectional views of semiconductor device structures, in accordance with some embodiments. FIG. 9A shows a semiconductor device structure (or a package structure), in accordance with some embodiments. The semiconductor device structure is similar to that shown in FIG. 8A. The main difference is that a conductive bump 810a' is formed between the conductive trace 402a and the conductive pillar 812 and covers the conductive trace 402a. As shown in FIG. 9A, side surfaces of the conductive trace 402a are covered by the conductive bump 810a'. In some embodiments, the materials and the formation methods of the conductive bump 810a' are similar to those of the conductive bump 410a shown in FIG. 4B.

FIG. 9B shows a semiconductor device structure (or a package structure), in accordance with some embodiments. The semiconductor device structure is similar to that shown in FIG. 8B. The main difference is that the conductive bump 810a' is formed between the conductive trace 302a and the conductive pillar 812 and covers the conductive trace 302a. As shown in FIG. 9B, side surfaces of the conductive trace 302a are covered by the conductive bump 810a'. In some embodiments, the materials and the formation methods of the conductive bump 810a' are similar to those of the conductive bump 110a shown in FIG. 3B.

Embodiments of the disclosure form conductive bumps and conductive features (such as UBM elements) over a conductive trace on a semiconductor substrate. The conductive trace has no wider (or protruded) region defined to serve as a pad region. The pitches between different conductive traces are significantly reduced since no specific pad region is defined. The layout area is not occupied by the wider (or protruded) region. Accordingly, the number of input and output (I/O) connections is significantly increased. A substrate is bonded with the semiconductor substrate to form a package structure through bonding a second conductive trace with the conductive bump. Fabrication cost and fabrication time are reduced, and the performance and the quality of the semiconductor device structure are improved.

In accordance with some embodiments, a semiconductor device structure is provided. The semiconductor device structure includes a semiconductor substrate and a dielectric layer over the semiconductor substrate. The semiconductor device structure also includes a conductive trace over the dielectric layer. The semiconductor device structure further includes a conductive feature over the conductive trace, and a width of the conductive feature is substantially equal to or larger than a maximum width of the conductive trace. In addition, the semiconductor device structure includes a conductive bump over the conductive feature.

In accordance with some embodiments, a semiconductor device structure is provided. The semiconductor device structure includes a semiconductor substrate and a dielectric layer over the semiconductor substrate. The semiconductor device structure also includes a conductive trace over the dielectric layer. The semiconductor device structure further includes a conductive feature over the conductive trace, and the conductive feature substantially extends beyond the conductive trace. In addition, the semiconductor device structure includes a conductive bump over the conductive feature.

In accordance with some embodiments, a method for forming a semiconductor device structure is provided. The method includes forming a dielectric layer over a semiconductor substrate and forming a dielectric layer over a semiconductor substrate. The method also includes forming a conductive feature over the conductive trace. A width of the conductive feature is substantially equal to or larger than a maximum width of the conductive trace. The method further includes forming a conductive bump over the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a dielectric layer disposed over the semiconductor substrate;
a conductive trace disposed over the dielectric layer;
an under-bump metallization (UBM) disposed over a segment, but not an entirety of, a top surface and a side surface of the conductive trace, wherein a width of the UBM is substantially equal to or larger than a maximum width of the conductive trace, and a first portion of the conductive trace covered by the UBM and a second portion of the conductive trace not covered by the UBM have substantially same widths; and
a conductive bump disposed over the UBM, wherein a sidewall of the conductive trace is surrounded by the conductive bump.

2. The semiconductor device structure as claimed in claim 1, wherein the UBM is in physical contact with the sidewall of the conductive trace.

3. The semiconductor device structure as claimed in claim 1, further comprising:
a second UBM disposed over the conductive trace; and
a second conductive hump disposed over the second UBM.

4. The semiconductor device structure as claimed in claim 3, wherein a width of the second UBM is substantially equal to or larger than the maximum width of the conductive trace.

5. The semiconductor device structure as claimed in claim 1, further comprising:
a substrate different from the semiconductor substrate; and
a second conductive trace disposed over the substrate, wherein the second conductive trace bonds with the conductive bump.

6. The semiconductor device structure as claimed in claim 5, wherein the width of the UBM is defined along a direction,
the conductive trace has a second width defined along the direction, and
a ratio of the width to the second width is in a range from about 0.5 to about 2.

7. The semiconductor device structure as claimed in claim 5, further comprising a protection material between the substrate and the semiconductor substrate, wherein the protection material surrounds, and is in direct contact with, the conductive bump, the UBM, and the conductive trace.

8. The semiconductor device structure as claimed in claim 1, wherein:
the conductive trace contains Al, Cu, or AlCu;
the UBM contains Ti, TiW, TiCu, or Ni; and
the conductive bump contains a solder material.

9. The semiconductor device structure as claimed in claim 1, wherein the conductive trace is electrically connected to a conductive line in the dielectric layer.

10. The semiconductor device structure as claimed in claim 1, wherein the UBM and the conductive trace have different top view profiles.

11. The semiconductor device structure as claimed in claim 1, wherein the UBM and the conductive bump have similar top view profiles.

12. A semiconductor device structure, comprising:
a semiconductor substrate;
a dielectric layer disposed over the semiconductor substrate;
a conductive trace disposed over the dielectric layer, the conductive trace extending in a first direction;
an under-bump metallization (UBM) disposed over a segment, but not an entirety of, a top surface and a side surface of the conductive trace, wherein the UBM substantially extends beyond the conductive trace in a second direction different from the first direction, and a first portion of the conductive trace covered by the UBM and a second portion of the conductive trace not covered by the UBM have substantially same widths; and
a conductive bump disposed over the UBM, wherein the conductive bump and the dielectric layer collectively surrounds the conductive trace in a cross-sectional view.

13. The semiconductor device structure as claimed in claim 12, further comprising:
a substrate different from the semiconductor substrate; and
a second conductive trace disposed over the substrate, wherein the second conductive trace bonds with the conductive bump.

14. The semiconductor device structure as claimed in claim 13, further comprising a protection material between the substrate and the semiconductor substrate, wherein the protection material is in direct contact with the conductive trace, the conductive bump, the UBM, and the second conductive trace.

15. The semiconductor device structure as claimed in claim 12, wherein the UBM extends on a first sidewall of the conductive trace, across an upper surface of the conductive trace, and onto a second sidewall of the conductive trace, wherein the UBM is in direct physical contact with the first sidewall, the upper surface, and the second sidewall of the conductive trace.

16. The semiconductor device structure as claimed in claim 12, wherein:
the conductive trace contains Al, Cu, or AlCu;
the UBM contains Ti, TiW, TiCu, or Ni; and
the conductive bump contains a solder material.

17. A method for forming a semiconductor device structure, comprising:
forming a dielectric layer over a semiconductor substrate;
forming a conductive trace over the dielectric layer;
forming a conductive feature over a segment, but not an entirety of, a top surface and a side surface of the conductive trace, wherein a width of the conductive feature is substantially equal to or larger than a maximum width of the conductive trace, and a first portion of the conductive trace covered by the conductive feature and a second portion of the conductive trace not covered by the conductive feature have substantially same widths; and
forming a conductive bump over the conductive feature in a manner such that a side wall of the conductive trace is surrounded by the conductive bump.

18. The method for forming a semiconductor device structure as claimed in claim 17, wherein no passivation layer is formed over the conductive trace after the formation of the conductive trace and before the formation of the conductive feature.

19. The method for forming a semiconductor device structure as claimed in claim 17, further comprising:

forming a second conductive trace over a substrate different from the semiconductor substrate; and
bonding the second conductive trace with the conductive bump.

20. The method for forming a semiconductor device structure as claimed in claim 19, further comprising forming a protection material between the substrate and the semiconductor substrate.

* * * * *